(12) United States Patent
Morita

(10) Patent No.: US 8,004,859 B2
(45) Date of Patent: Aug. 23, 2011

(54) ELECTRONIC APPARATUS

(75) Inventor: Hirofumi Morita, Fussa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 7 days.

(21) Appl. No.: 12/603,277

(22) Filed: Oct. 21, 2009

(65) Prior Publication Data
US 2010/0193230 A1    Aug. 5, 2010

(30) Foreign Application Priority Data

Jan. 30, 2009 (JP) ................................ 2009-019683

(51) Int. Cl.
*H05K 7/02* (2006.01)
*H05K 7/04* (2006.01)
(52) U.S. Cl. ....................................... 361/807; 361/810
(58) Field of Classification Search .................. 361/807, 361/810, 730, 752, 790, 797, 800, 748, 784, 361/796; 439/733.1, 625; 174/68.1, 250, 174/259, 260
See application file for complete search history.

(56) References Cited

U.S. PATENT DOCUMENTS

| | | | | | |
|---|---|---|---|---|---|
| 5,237,486 A | * | 8/1993 | LaPointe et al. | ......... | 361/679.27 |
| 5,822,182 A | * | 10/1998 | Scholder et al. | ......... | 361/679.57 |
| 5,973,920 A | * | 10/1999 | Altic et al. | ............... | 361/679.26 |
| 7,480,131 B2 | * | 1/2009 | Na et al. | .................... | 361/679.27 |
| 7,499,289 B2 | * | 3/2009 | Liang | ............................ | 361/796 |
| 2006/0169488 A1 | | 8/2006 | Kaji et al. | | |
| 2006/0171129 A1 | | 8/2006 | Berto et al. | | |

FOREIGN PATENT DOCUMENTS

| | | |
|---|---|---|
| JP | 55-29530 | 3/1980 |
| JP | 59-131173 | 7/1984 |
| JP | 02-54123 | 4/1990 |
| JP | 07-154038 | 6/1995 |
| JP | 2005-175339 | 6/2005 |
| JP | 2006-210852 | 8/2006 |
| JP | 2006-216944 | 8/2006 |
| JP | 2007-019426 | 1/2007 |

* cited by examiner

*Primary Examiner* — Hung S Bui
(74) *Attorney, Agent, or Firm* — Blakely, Sokoloff, Taylor & Zafman LLP

(57) ABSTRACT

According to one embodiment, an electronic apparatus includes a printed circuit board on which a part is mounted, a first connector for external connection provided in a peripheral portion of the printed circuit board, a reinforcing plate, a first fixing member, and a second fixing member. The reinforcing plate has a first portion to be attached in a region corresponding to the part on the printed circuit board, and a second portion attached to the printed circuit board to reinforce the first connector. The first fixing member fixes the first portion to the printed circuit board at an end of the first portion that is opposite to a portion facing the second portion. The second fixing member fixes the second portion to the printed circuit board.

5 Claims, 10 Drawing Sheets

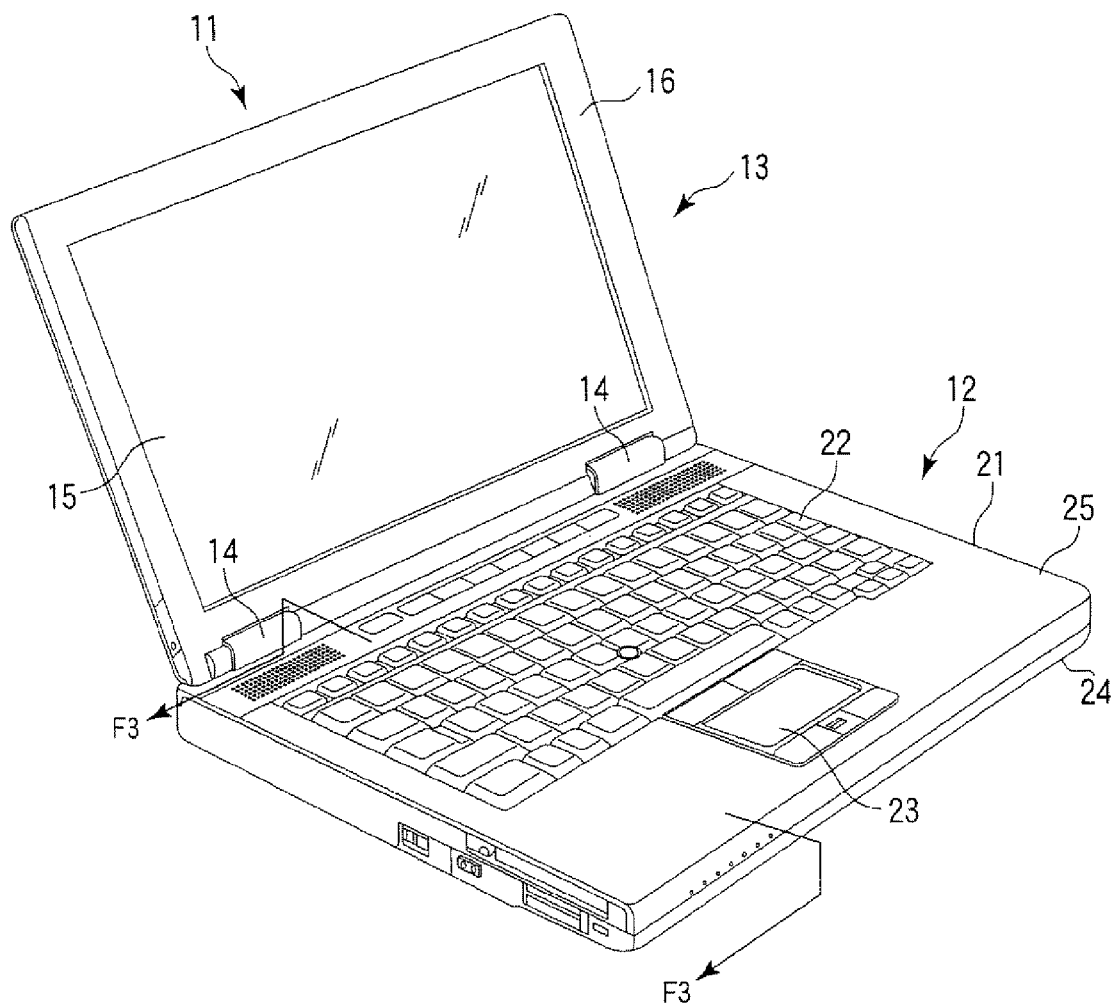
F I G. 1

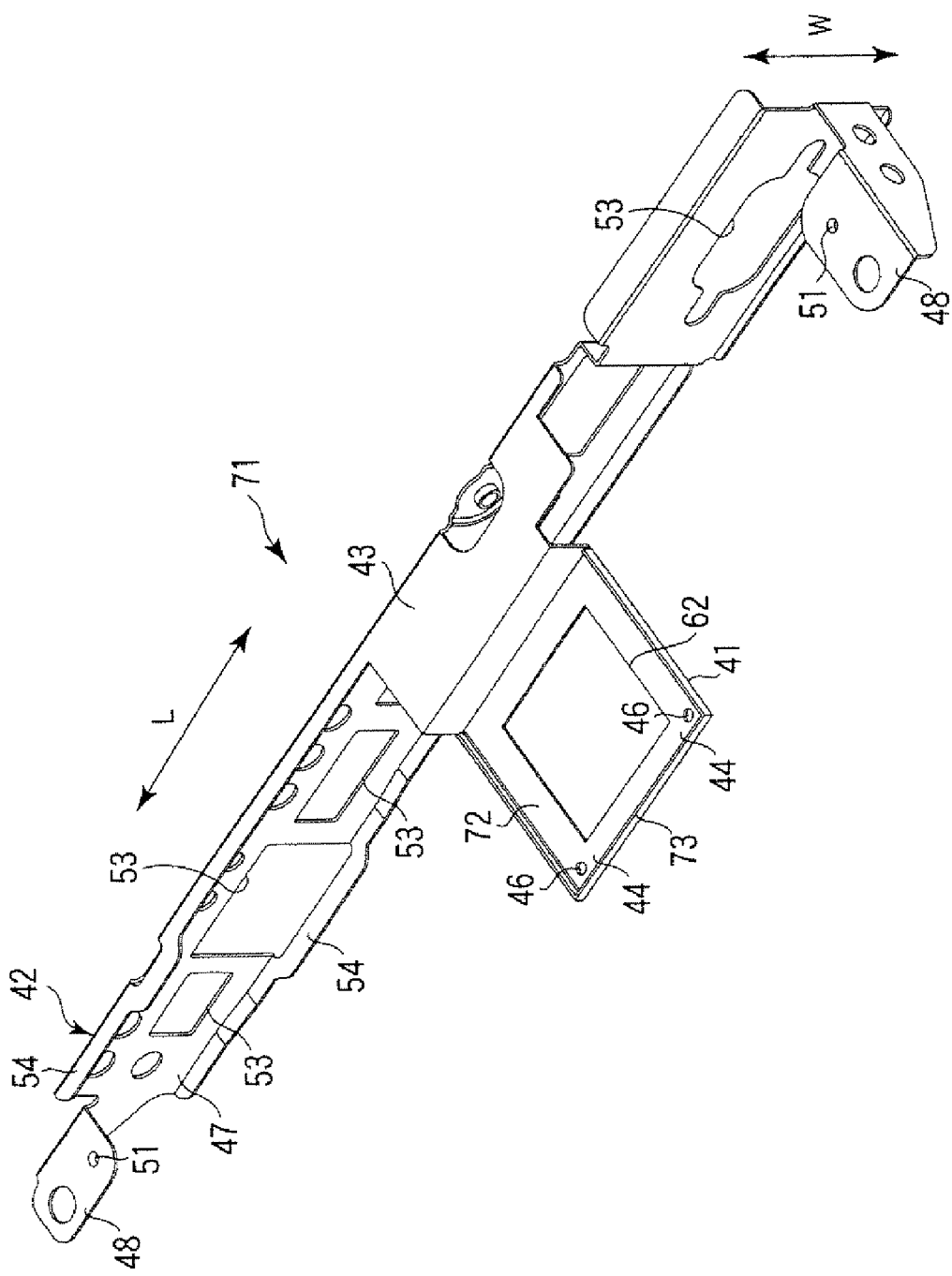
F I G. 8

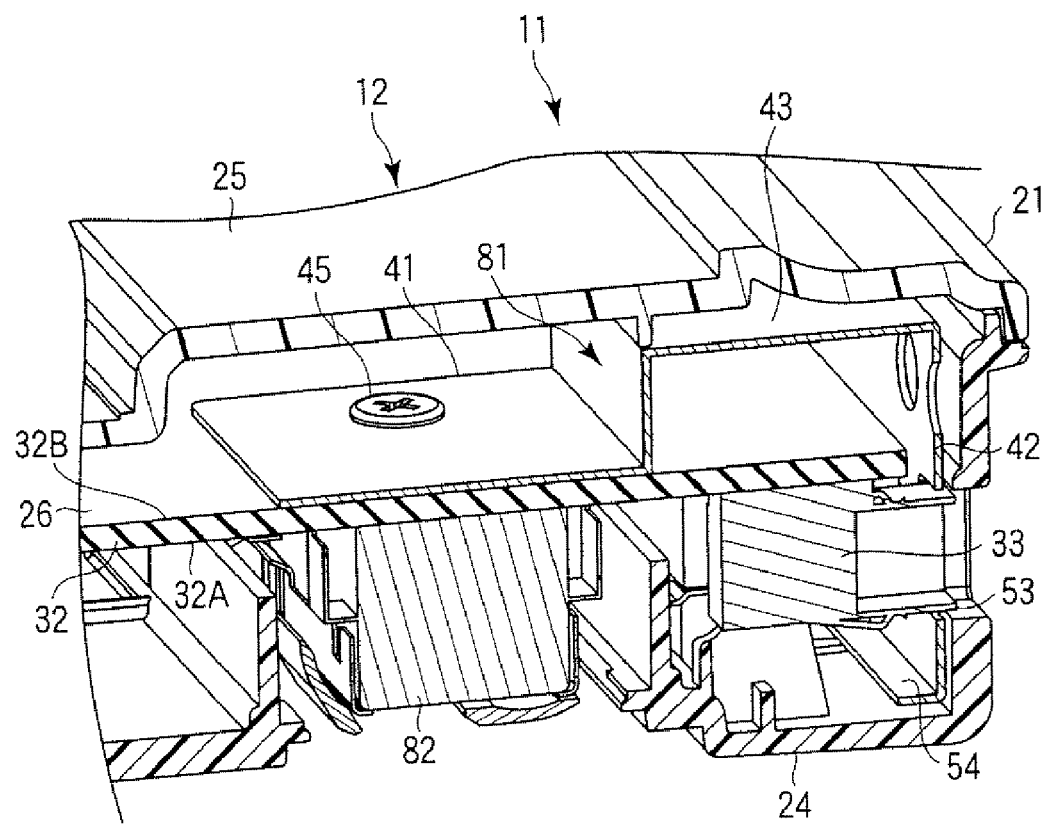
F I G. 10

ELECTRONIC APPARATUS

CROSS-REFERENCE TO RELATED APPLICATIONS

This application is based upon and claims the benefit of priority from Japanese Patent Application No. 2009-019683, filed Jan. 30, 2009, the entire contents of which are incorporated herein by reference.

BACKGROUND

1. Field

One embodiment of the present invention relates to an electronic apparatus having a reinforcing plate to protect a connector for external connection.

2. Description of the Related Art

Jpn. Pat. Appln. KOKAI Publication No. 2-54123 discloses a mount structure in which a switch is mounted on a printed wiring board. The mount structure comprises a printed wiring board, a switch and a housing thereof mounted on a peripheral portion of the printed wiring board and a switch front plate attached to the housing.

The switch front plate has a plate member extending on the rear surface of the printed wiring board.

To prevent the printed wiring board from being deformed, a reinforcing plate may be provided in a portion corresponding to a circuit part, such as a CPU. In this case, conventionally, the switch front plate and the reinforcing plate are separately fixed to the printed wiring board. Therefore, complicated work is required to fix them.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 1 is an exemplary perspective view of a portable computer according to a first embodiment of the present invention;

FIG. 8 is an exemplary perspective view of a reinforcing plate contained in a main body unit of a portable computer according to a third embodiment of the present invention;

FIG. 10 is an exemplary perspective view of the portable computer according to the fourth embodiment, showing the inside of the main body unit, taken along a vertically sectioned plane.

DETAILED DESCRIPTION

Figure 2:
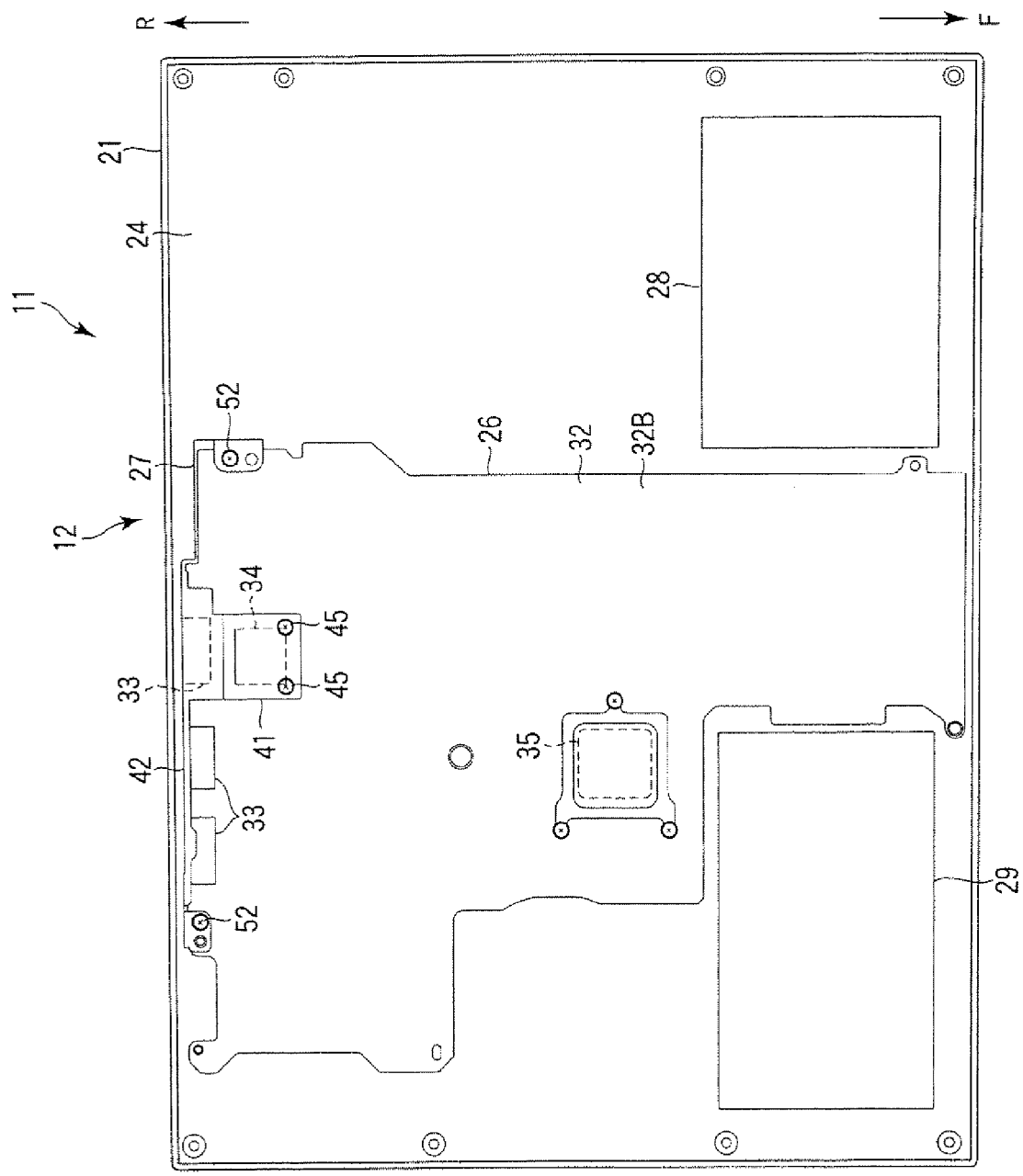
FIG. 2 is an exemplary top view of a main body unit of the portable computer shown in FIG. 1, showing a state where a second case is removed.

Various embodiments according to the invention will be described hereinafter with reference to the accompanying drawings. In general, according to one embodiment of the invention, an electronic apparatus includes a printed circuit board on which a part is mounted; a first connector for external connection provided in a peripheral portion of the printed circuit board; a reinforcing plate; a first fixing member; and a second fixing member. The reinforcing plate has a first portion to be attached in a region corresponding to the part on the printed circuit board, and a second portion attached to the printed circuit board to reinforce the first connector. The first fixing member fixes the first portion to the printed circuit board at an end of the first portion that is opposite to a portion facing the second portion. The second fixing member fixes the second portion to the printed circuit board.

An electronic apparatus according to a first embodiment of the present invention will be described below with reference to FIGS. 1 to 5. This specification defines a front side (or the user side) as the front F, a rear side viewed from the user as the rear R, a left side viewed from the user as the left, a right side viewed from the user as the right, an upside viewed from the user as up, and a down side viewed from the user as down.

As shown in FIG. 1, a portable computer 11 as an example of the electronic apparatus has a main body unit 12, a display unit 13, and hinge portions 14 located between the main body unit 12 and the display unit 13. The hinge portions 14 support the display unit 13 and can rotate the display unit 13 relative to the main body unit 12. The display unit 13 has a display 15 comprising a liquid crystal display and a cover 16 surrounding the display 15.

Figure 3:
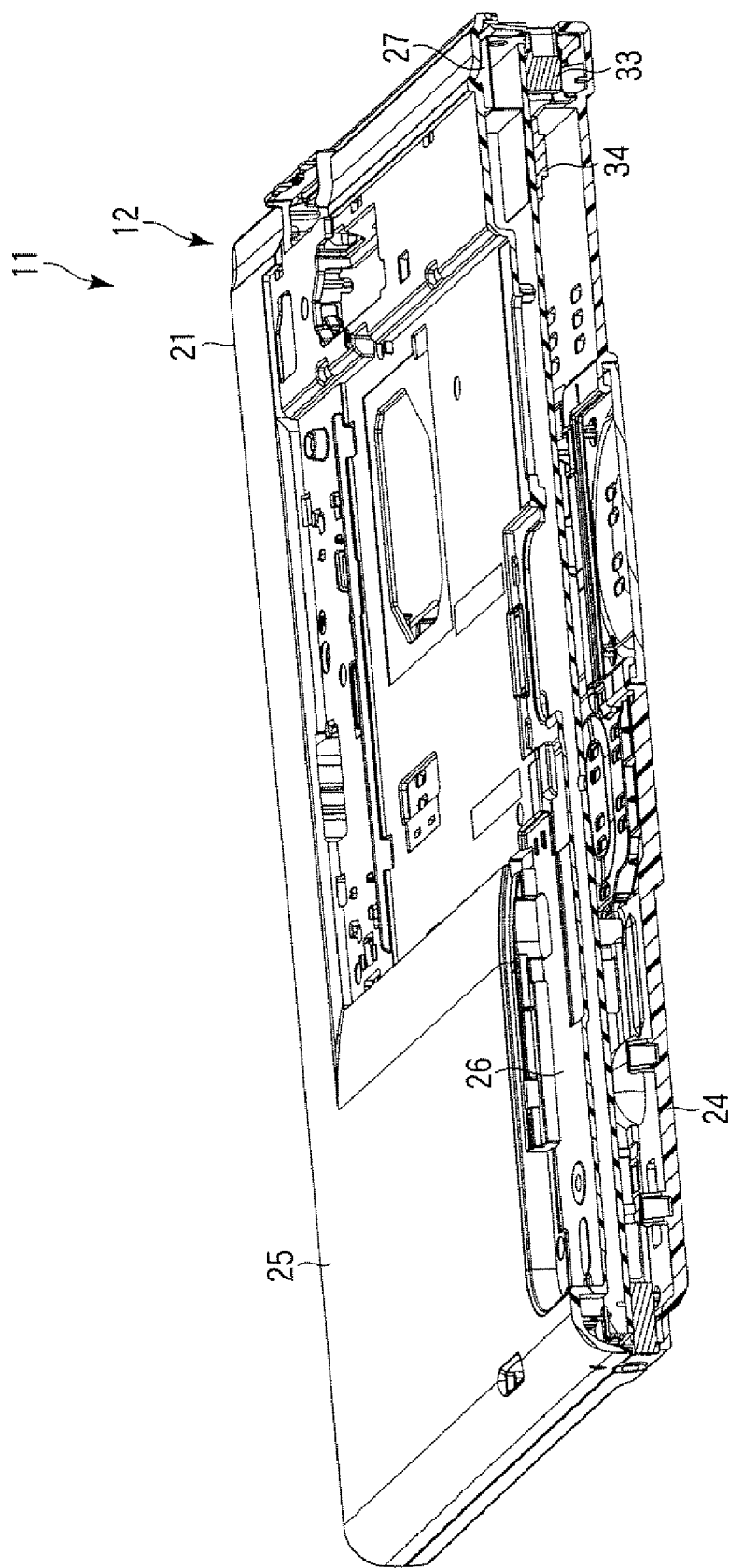
FIG. 3 is an exemplary perspective view of the portable computer shown in FIG. 1, showing the inside thereof, taken along the line F3-F3 in FIG. 1.

As shown in FIGS. 1-3, the main body unit 12 comprises a housing 21 made of synthetic resin, a keyboard 22 and a touch pad 23 both attached to the housing 21. The housing 21 has a first case 24 constituting a lower half and a second case 25 constituting an upper half. The main body unit 12 has, in the inside of the housing 21, a printed circuit board 26, a reinforcing plate 27 to prevent the printed circuit board 26 from being deformed, a first fixing member and a second fixing member to fix the reinforcing plate 27 to the printed circuit board 26, a hard disk drive (HDD) 28 and a slot 29 for an express card.

The printed circuit board 26 has a printed wiring board 32, which is a laminated copper plate formed of a plurality of copper wiring layers; a plurality of parts mounted on the printed wiring board 32; and a plurality of first connectors 33, mounted on a peripheral portion of the printed wiring board 32, for external connection. The printed wiring board 32 has a first surface 32A on which the plurality of parts are mounted, and a second surface 32B opposite to the first surface 32A. The plurality of parts include a CPU (central processing unit) 34, a north bridge 35 and a graphics chip. Each of them is a semiconductor package of a BGA (ball grid array) type (not shown) in which a semiconductor chip is embedded.

Figure 4:
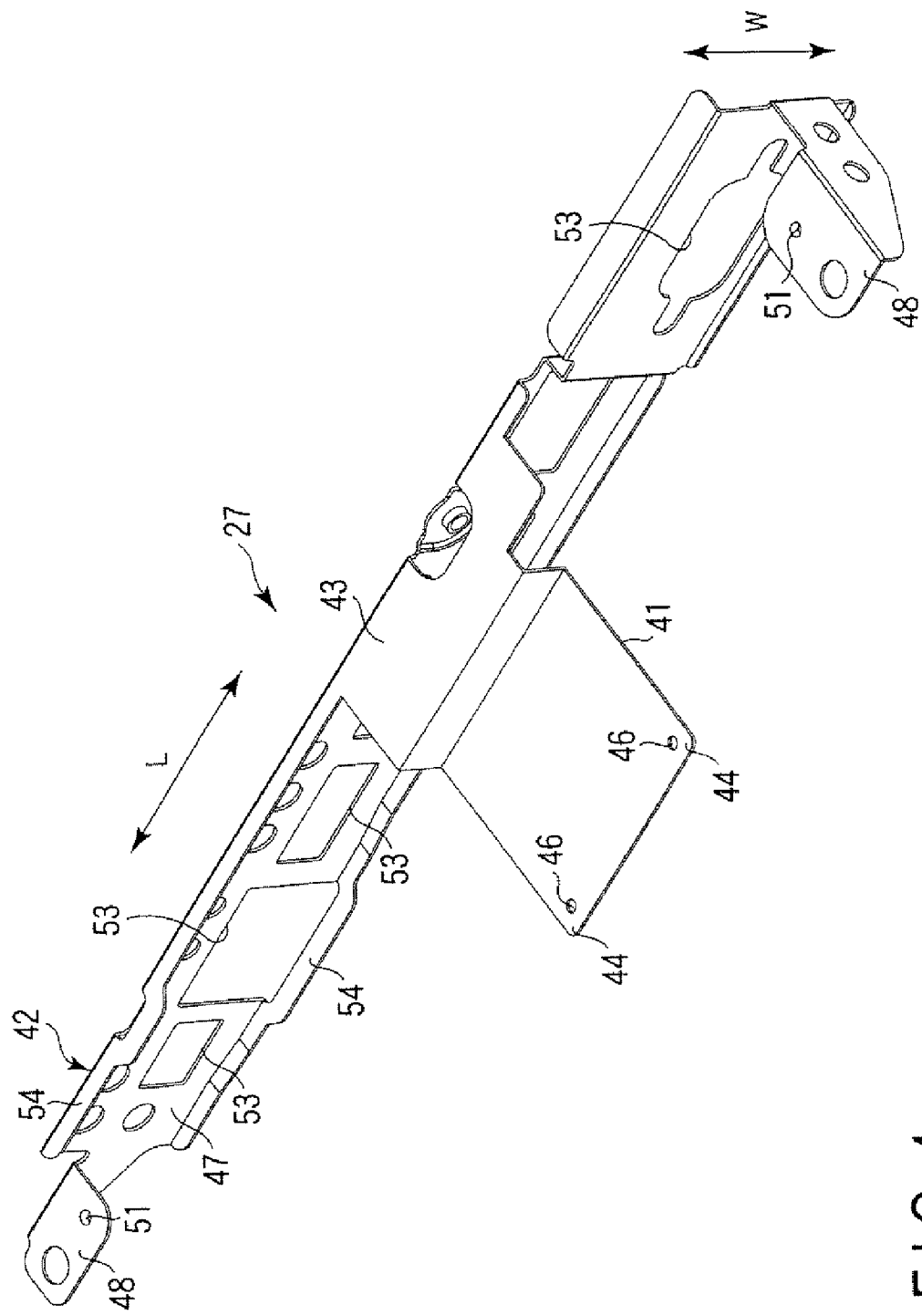
FIG. 4 is an exemplary perspective view of a reinforcing plate contained in the main body unit shown in FIG. 2.

As shown in FIG. 4, the reinforcing plate 27 is a metal plate made of, for example, stainless steel. The reinforcing plate 27 has a thickness of, for example, about 0.4 mm, and formed through bending by press working. The back plate generally used has a thickness of, for example, about 1.6 mm. Therefore, the reinforcing plate 27 is thinner than the back plate. The reinforcing plate 27 is integrally formed of a first portion 41 to be fixed in a position corresponding to the CPU 34; a second portion 42 extending from the first portion 41 to reinforce the first connectors 33; and a connecting portion 43 connecting the first portion 41 and the second portion 42.

The first portion 41 is disposed in parallel with the printed wiring board 32 and closely fixed to the second surface 32B of the printed wiring board 32. The first portion 41 is shaped as a rectangular plate. The first portion 41 has a pair of first fixing holes 46 in corner portions (end portions) 44 opposite to a portion which faces the second portion 42. First screws 45 as a first fixing member are inserted through the first holes 46, and fix the first portion 41 to the printed circuit board 26 at the corner portions 44.

The second portion 42 extends in a direction perpendicular to the printed wiring board 32 and the first portion 41. The second portion 42 is disposed outside from the peripheral portion of the printed wiring board 32. The second portion 42 has a main body portion 47 extending in the direction perpendicular to the printed wiring board 32, and arm-shaped fixing portions 48 respectively extending from the ends of the main body portion 47. The fixing portions 48 respectively have second fixing holes 51, and second screws 52 as second fixing members are inserted through the first fixing holes 51. The second screws 52 fix the second portion 42 to the printed circuit board 26 via the arm-shaped fixing portions 48.

The main body portion 47 of the second portion 42 has a plurality of openings 53 corresponding to the first connectors 33. The second portion 42 has second bent portions 54 extending in a direction parallel to the first portion 41. The second bent portions 54 project in parallel with the first portion 41 from the ends in a width direction W of the second portion 42 perpendicular to a longitudinal direction L thereof.

Figure 5:
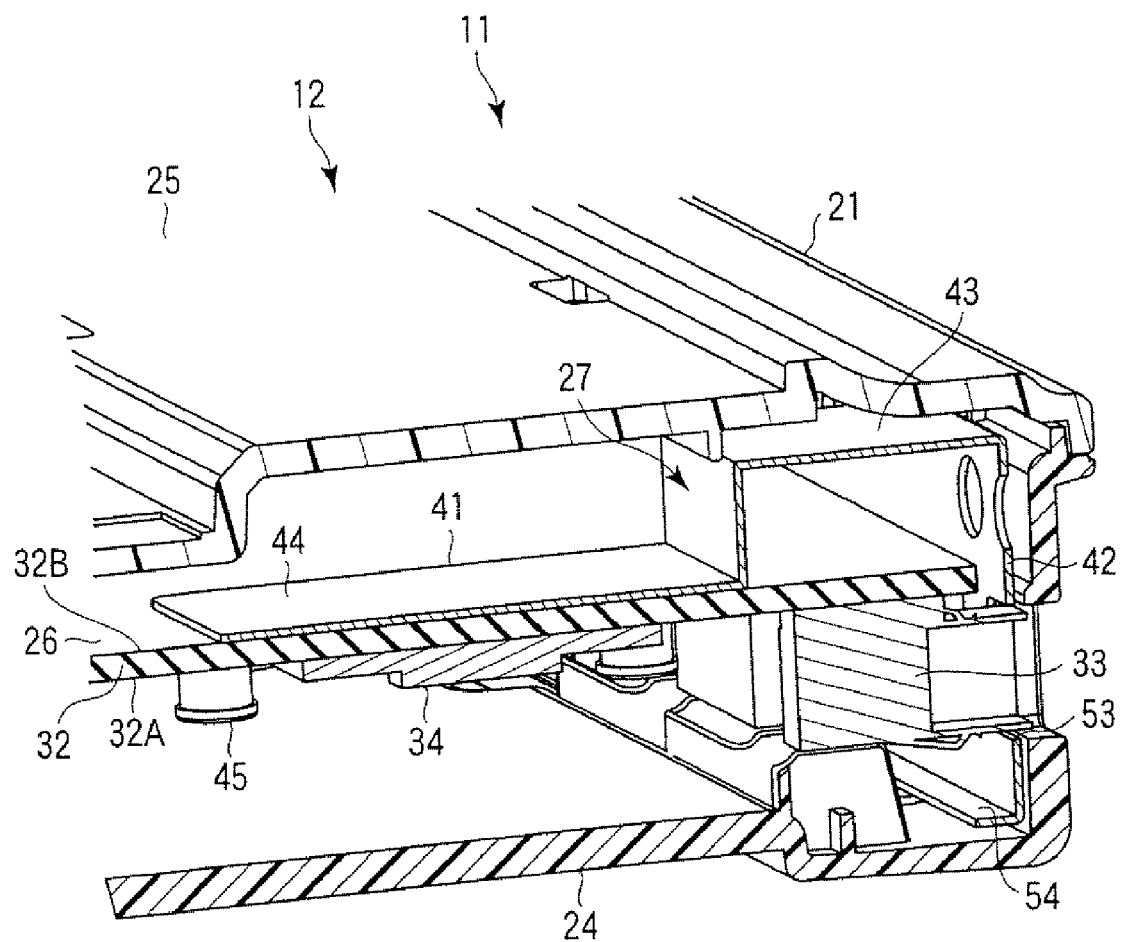
FIG. 5 is an exemplary enlarged perspective view of the main body unit shown in FIG. 3.

The connecting portion 43 is interposed between the first portion 41 and the second portion 42. As shown in FIG. 5, the connecting portion 43 has a substantially U-shaped cross section. The connecting portion 43 includes a surface parallel to the printed circuit board 26. The connecting portion 43 is located separately from the peripheral portion of the printed circuit board 26. Therefore, for example, one of the first connectors 33 may be located under the connecting portion 43, though not shown in the drawings. Further, since the connecting portion 43 is located separately from the printed circuit board 26, it may be deformed relatively freely. Therefore, even if either the first portion 41 or the second portion 42 is deformed, the connecting portion 43 can absorb the deformation and prevent the other from being deformed. The connecting portion 43 is formed integral with and continuous to the second bent portion 54.

A function of the reinforcing plate 27 of this embodiment will be described with reference to FIG. 5. When the user connects or disconnects a counterpart connector to the first connector 33, he or she may twist the former in a direction deviated from the correct inserting direction. In this case, according to the movement of the counterpart connector, the first connector 33 and the second portion 42 of the reinforcing plate 27 also move. At this time, the second portion 42 may be deformed. However, since the connecting portion 43 of this embodiment is deformable relatively freely, the deformation of the second portion 42 is absorbed by the connecting portion 43 and does not directly influence the first portion 41.

According to the first embodiment, the portable computer 11 includes the printed circuit board 26 on which the parts are mounted; the first connector 33 for external connection, provided in the peripheral portion of the printed circuit board 26; the reinforcing plate 27 having the first portion 41 positioned in the area corresponding to a part on the printed circuit board 26 and the second portion 42 attached to the printed circuit board 26 to reinforce the first connectors 33; the first fixing member which fixes the first portion 41 to the printed circuit board 26 at an end opposite to a part that faces the second portion 42; and the second fixing member which fixes the second portion 42 to the printed circuit board 26.

With this configuration, the part of the first portion 41 that faces the second portion 42 is supported by the second portion 42. Therefore, the fixing plate 27 can be fixed to the printed circuit board 26 only by the first and second fixing members. Thus, it is unnecessary to use a fixing member in the part of the first portion 41 that faces the second portion 42. Accordingly, the number of the fixing members can be less as compared to the conventional art. As a result, the number of processes to fix the reinforcing plate 27 to the printed circuit board 26 can be reduced. Moreover, in recent years, it is very important to easily recycle the parts contained in an electronic apparatus and easily repair the printed circuit board 26 and the circuit parts. The reinforcing plate 27 of this embodiment is particularly advantageous in that the number of fixing members and the number of processes to remove the reinforcing plate 27 are less, so that the workability in recycling or repair can be improved.

In this embodiment, the first portion 41 extends along the printed circuit board 26 and the second portion 42 extends in the direction crossing the first portion 41. With this configuration, the first portion 41 and the second portion 42 constitute a bent structure, thereby improving the rigidity of the reinforcing plate 27 as a whole.

The reinforcing plate 27 has the connecting portion 43, which is interposed between the first portion 41 and the second portion 42 and separate from the printed circuit board 26. In this configuration, since the connecting portion 43 is separate from the printed circuit board 26, it is allowed to deform relatively freely. Therefore, the connecting portion 43 can be utilized as a buffer; that is, even if the second portion 42 of the reinforcing plate 27 is deformed, the deformation (stress) is prevented from being directly transmitted to the first portion 41. Accordingly, if the second portion 42 is deformed when, for example, the counterpart connector is connected to or disconnected from the first connector 33, the deformation in the second portion 42 is absorbed by the connecting portion 43. Consequently, it is possible to prevent the deformation (load), which has occurred in the second portion 42, from being transmitted to the printed circuit board 26 via the first portion 41.

In this embodiment, the connecting portion 43 has the substantially U-shaped cross section. With this configuration, the connecting portion 43 can have a plurality of bends. Thus, the mechanical strength of the reinforcing plate 27 is improved, while the connecting portion 43 has a deformation absorbing function.

The second portion 42 has the second bent portion 54, which extends in parallel with the first portion 41 from the ends in the width direction W perpendicular to the longitudinal direction L of the second portion 42. With this configuration, since the second bent portion 54 is provided along the longitudinal direction L, the rigidity of the second portion 42 can be further ensured. The connecting portion 43 is formed integral with the second bent portion 54. With this configuration, the strength of the connecting portion 43 is improved and the structure of the reinforcing plate 27 is simplified as compared to the case in which the connecting portion 43 is separate from the second bend portion 54. As a result, the first portion 41 is held by greater force and the first portion 41 does not separate above the printed circuit board 26. Consequently, deformation of the printed circuit board 26 can be effectively prevented.

Figure 6:
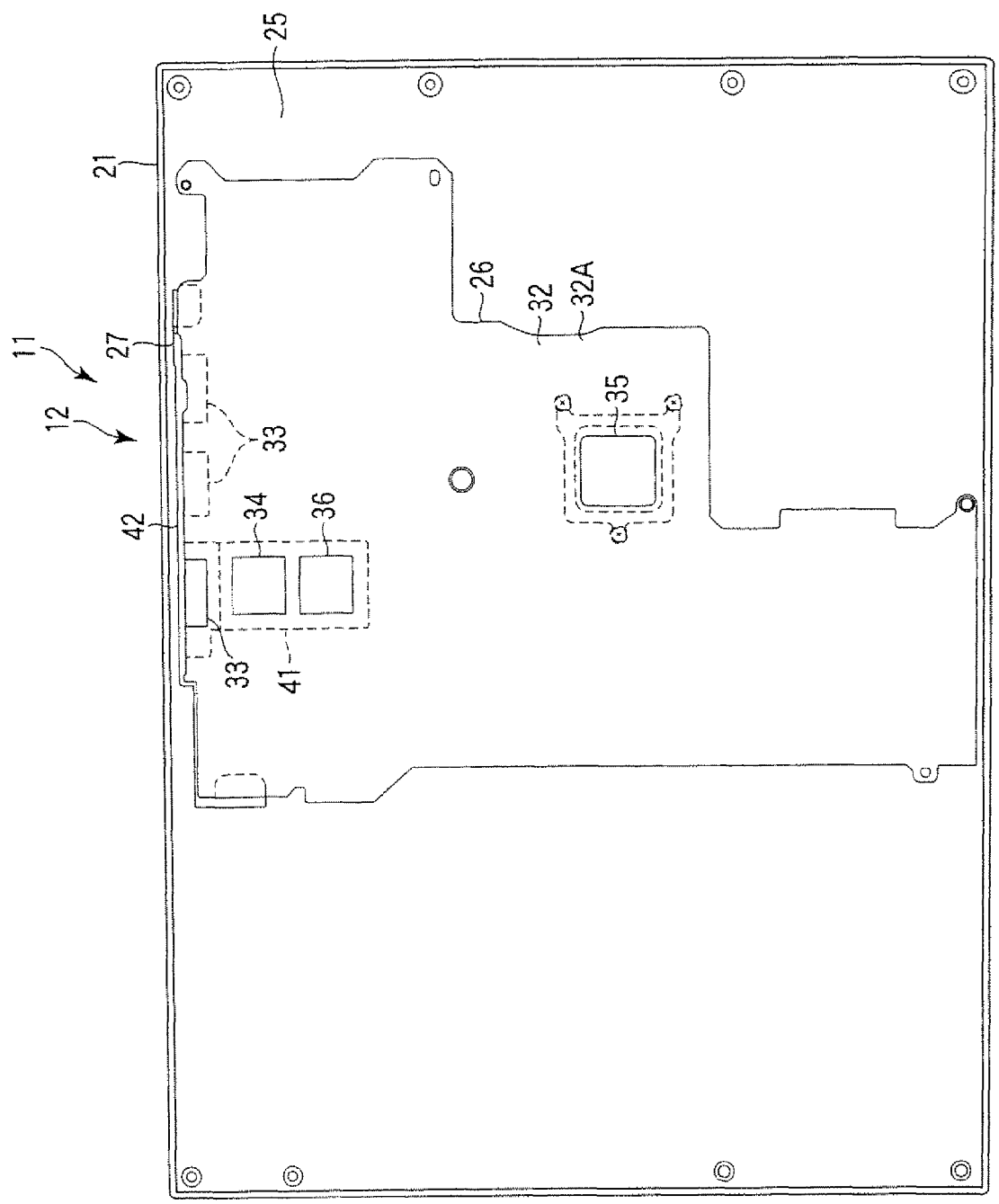
FIG. 6 is an exemplary bottom view of the main body unit, in a state where a first case is removed, showing a modification of the reinforcing plate of the first embodiment.

In the first embodiment, the first portion 41 of the reinforcing plate 27 is formed to correspond to one part, for example, the CPU 34. However, the reinforcing plate 27 is not limited to this shape. The first portion 41 of the reinforcing plate 27 may be formed to correspond to two parts, for example, the CPU 34 and a graphics chip 36, as shown in FIG. 6, or to correspond to more parts.

Figure 7:
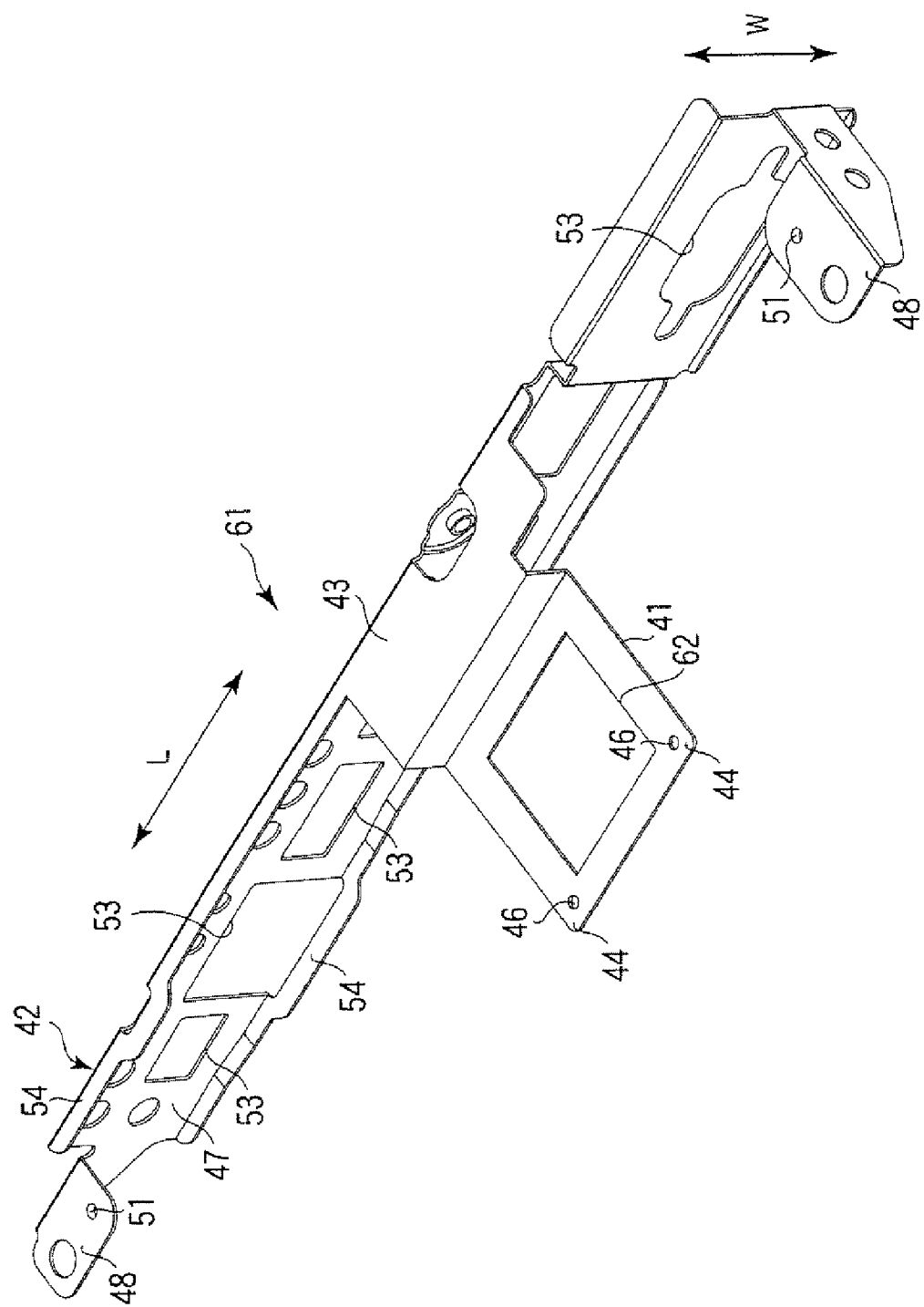
FIG. 7 is an exemplary perspective view of a reinforcing plate contained in a main body unit of a portable computer according to a second embodiment of the present invention.

A second embodiment of the portable computer will now be described with reference to FIG. 7. A portable computer 11, an example of an electronic apparatus of the second embodiment, has the same parts as those of the first embodiment, except for a reinforcing plate 61, which is different in shape from the reinforcing plate 27. Therefore, the difference will mainly be described below, while descriptions of the same parts, identified by the same reference numerals as those of the first embodiment, will be omitted.

The portable computer 11 of the second embodiment has the same appearance as shown in FIG. 1. The reinforcing plate 61 is integrally formed of a first portion 41 to be fixed in a position corresponding to a CPU 34; a second portion 42 extending from the first portion 41 to reinforce a plurality of first connectors 33; and a connecting portion 43 connecting the first portion 41 and the second portion 42.

The first portion 41 is shaped as a rectangular plate, and closely fixed to a second surface 32B of a printed wiring board 32. The first portion 41 has a rectangular through hole 62 in its central portion. Inside the through hole 62, an accessory (not shown), such as a capacitor adapted for the CPU 34, is arranged on a first surface 32A of the printed circuit board 26. In this embodiment, the capacitor or the like is arranged within the through hole 62, but the arrangement is not limited to this. The first portion 41 may be closely attached to the first surface 32A of the printed circuit board 26 and the CPU 34 in itself may be arranged within the through hole 62.

The first portion 41 has a pair of first fixing holes 46 in corner portions (end portions) 44 opposite to a portion which faces the second portion 42. First screws 45 as a first fixing member are inserted through the first fixing holes 46, and fix the first portion 41.

The second portion 42 extends in a direction perpendicular to the printed wiring board 32 and the first portion 41. The second portion 42 has a main body portion 47 extending in the direction perpendicular to the printed wiring board 32, and arm-shaped fixing portions 48 respectively extending from the ends of the main body portion 47. The second portion 42 has second bent portions 54 extending in a direction parallel to the first portion 41. The second bent portions 54 project in parallel with the first portion 41 from the ends in a width direction W of the second portion 42 perpendicular to a longitudinal direction L thereof.

The connecting portion 43 is interposed between the first portion 41 and the second portion 42, and separate from the peripheral portion of the printed circuit board 26. The connecting portion 43 has a substantially U-shaped cross section. The connecting portion 43 is formed integral with and continuous to the second bent portion 54.

According to the second embodiment, the part is a circuit part embedded with a semiconductor chip, and the first portion 41 has the through hole 62 in the central portion thereof. With these features, an accessory adapted for the circuit part, such as a capacitor, is arranged within the through hole 62 or the circuit part in itself may be arranged within the through hole 62. In general, the capacitor or the like is mounted on the rear surface opposite to the surface on which the circuit part is mounted.

A third embodiment of the portable computer will now be described with reference to FIG. 8. A portable computer 11, an example of an electronic apparatus of the third embodiment, has the same parts as those of the first embodiment, except for a reinforcing plate 71, which is different in shape from the reinforcing plate of the first embodiment. Therefore, the difference will mainly be described below, while descriptions of the same parts, identified by the same reference numerals as those of the first embodiment, will be omitted.

The portable computer 11 of the third embodiment has the same appearance as shown in FIG. 1. The reinforcing plate 71 is integrally formed of a first portion 41 to be fixed in a position corresponding to a part, i.e., a CPU 34; a second portion 42 extending from the first portion 41 to reinforce a plurality of first connectors 33; and a connecting portion 43 connecting the first portion 41 and the second portion 42.

The first portion 41 is shaped as a rectangular plate, and closely fixed to a second surface 32B of a printed wiring board 32. The first portion 41 has a main body 72, a rectangular through hole 62 provided in a central portion of the main body 72 and a first bent portion 73 which rises from the periphery of the main body 72. The first bent portion 73 projects in a direction perpendicular to the main body 72 of the first portion 41. An accessory (not shown), such as a capacitor adapted for the CPU 34, is arranged within the through hole 62. The first portion 41 has a pair of first fixing holes 46 in corner portions (end portions) 44 opposite to a portion which faces the second portion 42. First screws 45 as a first fixing member are inserted through the first fixing holes 46.

The second portion 42 extends in a direction perpendicular to the printed wiring board 32 and the first portion 41. The second portion 42 has a main body portion 47 extending in the direction perpendicular to the printed wiring board 32, and arm-shaped fixing portions 48 respectively extending from the ends of the main body portion 47. The second portion 42 has second bent portions 54 extending in a direction parallel to the first portion 41. The second bent portions 54 project in parallel with the first portion 41 from the ends in a width direction W of the second portion 42 perpendicular to a longitudinal direction L thereof.

The connecting portion 43 is interposed between the first portion 41 and the second portion 42. The connecting portion 43 is located separately from the peripheral portion of the printed circuit board 26. The connecting portion 43 is formed integral with and continuous to the second bent portion 54.

According to the third embodiment, the first portion 41 has the first bent portion 73 projecting from its peripheral portion. With this configuration, the first portion 41 keeps its mechanical strength though it has the through hole 62. Since the first bent portion 73 is formed by press working together with the other bent portions, the forming of the first bent portion 73 does not require an increase in number of steps for forming the reinforcing plate 71.

A fourth embodiment of the portable computer will be described with reference to FIGS. 9 and 10. A portable computer 11, an example of an electronic apparatus of the fourth embodiment, has the same parts as those of the first embodiment, except for a reinforcing plate 81, which is different in shape from the reinforcing plate 27. The fourth embodiment is further different from the first embodiment in the kind of a part reinforced by the reinforcing plate 81. Therefore, the differences will mainly be described below, while descriptions of the same parts, identified by the same reference numerals as those of the first embodiment, will be omitted.

The portable computer 11 of the fourth embodiment has the same appearance as shown in FIG. 1. A main body unit 12, in the inside of a housing 21, a printed circuit board 26, a reinforcing plate 81 to prevent the printed circuit board 26 from being deformed, a first fixing member and a second fixing member to fix the reinforcing plate 81 to the printed circuit board 26, a hard disk drive 28 and a slot 29 for an express card.

As shown in FIG. 10, the printed circuit board 26 has a printed wiring board 32, a part mounted on the printed wiring board 32, and a plurality of first connectors 33, mounted on a peripheral portion of the printed wiring board 32, for external connection. The printed wiring board 32 has a first surface 32A on which the part is mounted, and a second surface 32B opposite to the first surface 32A. The part is constituted by a second connector 82 independent of the first connectors 33. The second connector 82 is, for example, a docking connector, and can be inserted into a counterpart connector provided in a docking station (not shown) to which the portable computer 11 is connected. The direction of insertion of the second connector 82 is perpendicular to the printed circuit board 26.

Figure 9:
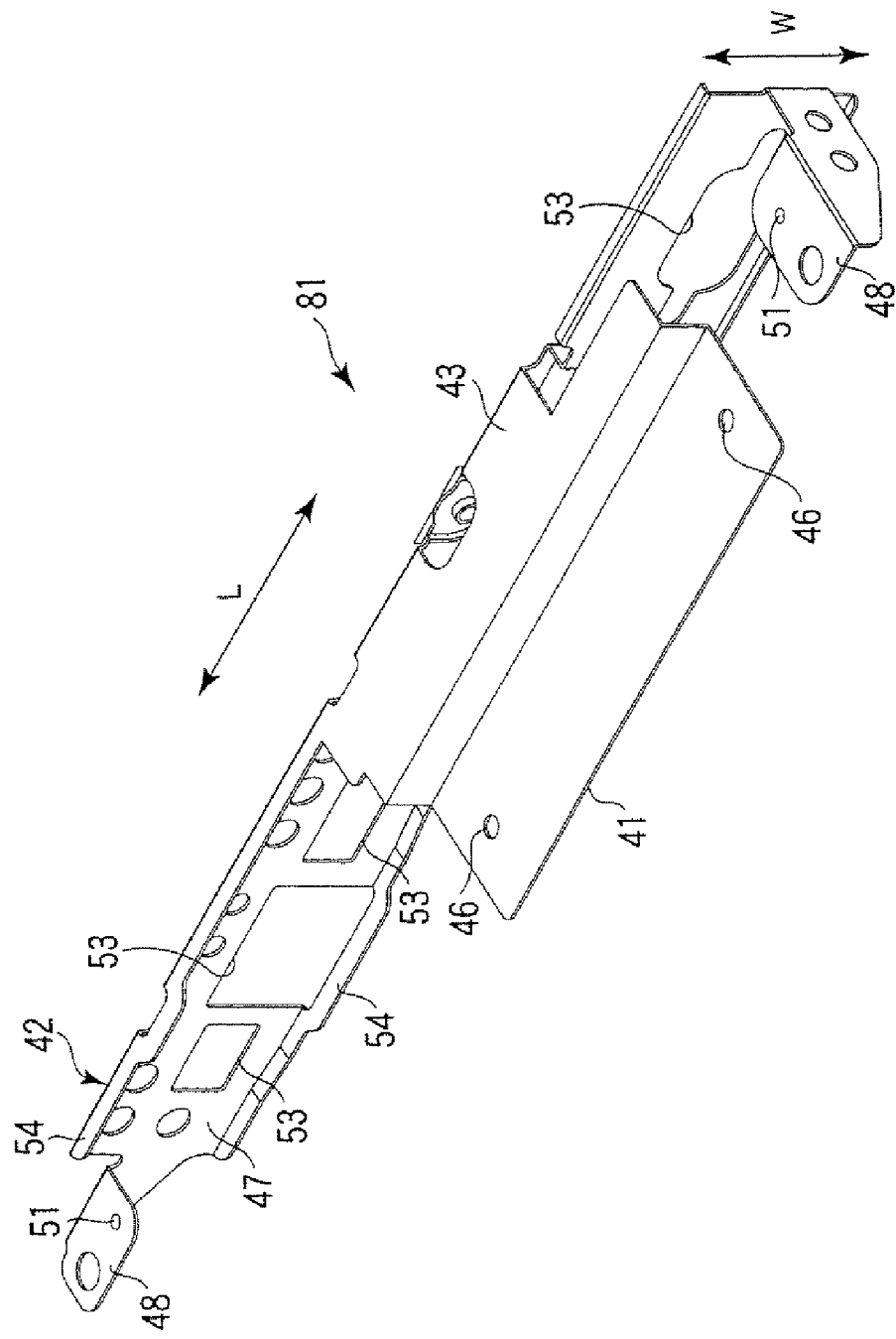
FIG. 9 is an exemplary perspective view of a reinforcing plate contained in a main body unit of a portable computer according to a fourth embodiment of the present invention.

As shown in FIG. 9, the reinforcing plate 81 is integrally formed of a first portion 41 to be fixed in a position corresponding to the second connector 82; a second portion 42 extending from the first portion 41 to reinforce the first connectors 33; and a connecting portion 43 connecting the first portion 41 and the second portion 42.

The first portion 41 is shaped as a rectangular plate and closely fixed to the second surface 32B of the printed wiring board 32. The first portion 41 has a pair of first fixing holes 46 in end portions in a longitudinal direction L thereof and first screws 45 as a first fixing member are inserted through the fixing holes. The first screws 45 fix the first portion 41 and the second connector 82 to the printed circuit board 26.

The second portion 42 extends in a direction perpendicular to the printed wiring board 32 and the first portion 41. The second portion 42 has a main body portion 47 extending in the direction perpendicular to the printed wiring board 32, and arm-shaped fixing portions 48 respectively extending from the ends of the main body portion 47. The second portion 42 has second bent portions 54 extending in a direction parallel to the first portion 41.

The connecting portion 43 is interposed between the first portion 41 and the second portion 42. The connecting portion 43 is located separately from the peripheral portion of the printed circuit board 26. The connecting portion 43 is formed integral with and continuous to the second bent portion 54.

According to the fourth embodiment, the portable computer 11 includes the printed circuit board 26 on which the parts are mounted; the first connectors 33 for external connection, provided in the peripheral portion of the printed circuit board 26; the reinforcing plate 81 having the first portion 41 positioned in the area corresponding to the part on the printed circuit board 26 and the second portion 42 attached to the printed circuit board 26 to reinforce the first connectors 33; the first fixing member which fixes the first portion 41 and the part to the printed circuit board 26; and the second fixing member which fixes the second portion 42 to the printed circuit board 26.

With this configuration, the part and the reinforcing plate 81 can be fixed simultaneously to the printed circuit board 26 by the first fixing member. The part is the second connector 82 located separately from the first connectors 33 and the direction of insertion of the second connector 82 is perpendicular to the printed circuit board 26. When the second connector 82 mounted on the printed circuit board 26 is inserted and removed from the counterpart connector, much stress may act on the printed circuit board 26. With the configuration described above, even if much stress acts on the printed circuit board 26, the printed circuit board 26 is prevented from deformation because of the rigidity of the reinforcing plate 81. As a result, the circuits in the printed circuit board 26 are effectively protected from breakage.

The electronic apparatus is not limited to the portable computer 11 described above as the embodiments, but the present invention may be applied to another type of electronic apparatus, such as a cellular phone. In the embodiments described above, the first portion 41 is located in a position corresponding to a part on the printed circuit board 26, but the position is not limited thereto. The first portion 41 may cover a part or all of the printed circuit board 26 to reinforce the printed circuit board 26. Alternatively, the first portion 41 may have a form of a rod extending from the second portion 42 reinforce the printed circuit board 26.

In the first to third embodiments described above, the first portion 41 has the pair of first fixing holes 46 in the end portions (corner portions 44) opposite to the portion which faces the second portion 42, and first screws 45 as the first fixing member are inserted through the first fixing holes 46. However, the first fixing holes 46 may be provided in the four corner portions of the first portion 41 and the first screws 45 may be inserted through the respective holes. Further, the electronic apparatus may be modified variously without departing from the sprit or scope of the gist of the invention.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

What is claimed is:

1. An electronic apparatus comprising:
a printed circuit board including a printed wiring board and a part mounted on the print wiring board;
a first connector provided in a peripheral portion of the printed wiring board separately from the part;
a reinforcing plate having a first portion extending in a direction along the printed wiring board and to be attached in a region corresponding to the part on the printed circuit board, a second portion extending in a direction crossing the first portion at a position outside the peripheral portion of the printed wiring board and attached to the printed circuit board to reinforce the first connector, and a connecting portion which connects the first portion and the second portion and provided with a position away from the printed wiring board;

a first fixing member which fixes the first portion to the printed circuit board at an end of the first portion that is opposite to a portion facing the second portion; and a second fixing member which fixes the second portion to the printed circuit board, wherein the part is a circuit part embedded with a semiconductor chip, and the first portion has a through hole in its central portion.

2. The electronic apparatus of claim 1, wherein the connecting portion has a surface parallel to the printed circuit board.

3. The electronic apparatus of claim 1, wherein the first portion has a first bent portion projecting from its peripheral portion.

4. The electronic apparatus of claim 3, wherein the second portion has a second bent portion, which projects in a direction parallel to the first portion from ends in a width direction of the second portion perpendicular to a longitudinal direction thereof.

5. The electronic apparatus of claim 4, wherein the connecting portion is formed integral with the second bent portion.

* * * * *